United States Patent [19]

Nakagawa

[11] Patent Number: 4,900,694
[45] Date of Patent: Feb. 13, 1990

[54] PROCESS FOR THE PREPARATION OF A MULTI-LAYER STACKED JUNCTION TYPED THIN FILM TRANSISTOR USING SEPERATE REMOTE PLASMA

[75] Inventor: Katsumi Nakagawa, Nagahama, Japan

[73] Assignee: Canon Kabushiki Kaisha, Tokyo, Japan

[21] Appl. No.: 171,465

[22] Filed: Mar. 21, 1988

[30] Foreign Application Priority Data

Mar. 23, 1987 [JP] Japan .................... 62-68302

[51] Int. Cl.$^4$ .............. H01L 21/20; H01L 21/306
[52] U.S. Cl. ................. 437/109; 148/DIG. 45; 148/DIG. 122; 427/39; 357/4; 437/171; 437/233; 437/911; 437/967
[58] Field of Search ............. 148/DIG. 41, 48, 45, 148/79, 93, 110, 169, 122; 156/610–615; 118/50.1, 723; 427/35, 39, 42, 531, 54.1, 38; 437/18, 19, 81, 82, 101, 103, 113, 170, 171, 173, 238, 241, 908, 937, 942, 109, 110, 911, 967; 357/4, 22, 59

[56] References Cited

U.S. PATENT DOCUMENTS

| | | | |
|---|---|---|---|
| 4,500,565 | 2/1985 | Hiramoto | 427/39 |
| 4,522,674 | 6/1985 | Ninomiya et al. | 427/38 |
| 4,532,199 | 7/1985 | Ueno et al. | 427/39 |
| 4,544,423 | 10/1985 | Tsuge et al. | 437/81 |
| 4,628,862 | 12/1986 | Kamiya | 118/723 |
| 4,657,777 | 4/1987 | Hirooka et al. | 427/39 |
| 4,716,048 | 12/1987 | Ishihara et al. | 427/39 |
| 4,716,852 | 1/1988 | Tsujii et al. | 418/723 |
| 4,717,585 | 1/1988 | Ishihara et al. | 427/53.1 |
| 4,717,586 | 1/1988 | Ishihara et al. | 427/39 |
| 4,772,486 | 9/1988 | Ishihara et al. | 427/39 |
| 4,772,570 | 7/1988 | Kanai et al. | 437/109 |

FOREIGN PATENT DOCUMENTS

| | | | |
|---|---|---|---|
| 0035601 | 2/1985 | Japan | 427/39 |
| 0035603 | 2/1985 | Japan | 427/39 |
| 0035606 | 2/1985 | Japan | 427/39 |
| 0035607 | 2/1985 | Japan | 427/39 |

Primary Examiner—Olik Chaudhuri
Assistant Examiner—William Bunch
Attorney, Agent, or Firm—Fitzpatrick, Cella, Harper & Scinto

[57] ABSTRACT

A process for the preparation of a multi-layers stacked junction typed thin film transister of which electric amplification factor ($\beta$) at the time of the base electrode or the emitter electrode being grounded is about 10 and which has an excellent amplifying operation.

The process is characterized in that of least the base region is formed by introducing a precursor A generated by activating a gaseous raw material (i) containing at least silicon atom and halogen atom in an activation space (a), a precursor B generated by activating a gaseous raw material (ii) containing at least hydrogen atom in an activation space (6), and if necessary, a precursor C generates by activating a gaseous raw material (iii) containing at least Group III atom or Group V atom of the Periodic Table in either the activation space (a) or the activation space (b), or in an different activation space (c) into a film forming space having a substrate being maintained with a desired temperature therein and chemically reacting them to thereby form a polycrystal silicon film to constitute at least its base region.

5 Claims, 9 Drawing Sheets

PROCESS FOR THE PREPARATION OF A MULTI-LAYER STACKED JUNCTION TYPED THIN FILM TRANSISTOR USING SEPERATE REMOTE PLASMA

FIELD OF THE INVENTION

This invention relates to a process for preparing a junction type thin film transistor having a collector region, a base region and an emitter region which is usable in thin film type image-reading devices, thin film type image display devices and the like.

More particularly it relates a process for preparing at least the base region in said junction type transistor using a precursor containing at least silicon atom and halogen atom and another precursor containing at least hydrogen atom.

BACKGROUND OF THE INVENTION

In recent years, there has been popularized to use a liquid crystal display element as a display means in pocket televisions and office machines such as word processor. Besides this, there is also a contact type line sensor having a reading part of the same size as an original in a minuature facsimile.

In such devices, a plurality of elements such as liquid crystal cells, photosensor cells, etc. are array-like arranged either in one-dimensional state or in two-dimensinal state. In order to actuate each of such elements as arranged in a device, there is usually employed an electrode forming methods by means of bonding techniques or other method by way of a matrix electrode forming technique. However many of these methods are problematic for the reason that it is difficult to make those element to effectively exhibit their functions as desired and it makes a device costly.

In view of this, there is an increased demand to provide a simplified transistor of which constituent elements being arranged on a substrate which will make improvements in the quality of an image to be displayed and reading speed, and also in the cost of a product.

In order to reply to the above demand, there have been proposed field effect transistors of insulating gate type (hereinafter referred to as "IG-FET") of which constituent elements are an amorphous silicon film deposited by way of a glow discharge method or from a polycrystal silicon film deposited by way of a thermal induced chemical vapor deposition method as shown in FIG. 9. In FIG. 9, there is shown a substrate (glass plate) 901, channel forming region 902, drain region 903, source region 904, drain electrode 905, source electrode 906, gate insulating film 907 and gate electrode 908.

However, as for such electric field effect transistors of insulating gate type as shown in FIG. 9, although its preparation process is relatively simple, there are problems due to undesired influences of an interface level and the like and other than this, it is difficult to coordinate the characteristics of a plurality of the constituent elements and it is also difficult to raise the reproducibilities of the characteristics to be exhibited by said plurality of the constituent elements principally because of utilizing a semiconductor part adjacent to the gate insulating film.

Other than the above IG-FET, there has been proposed a junction type thin film transistor (hereinafter referred to as "J-TFT") as shown in FIG. 10.

In FIG. 10, there are shown a n+ wafer 1001, collector region 1002, base region 1003, emitter region 1004, base electrodes 1005 and 1006, and emitter electrode 1007.

And this J-TFT has been evaluated as being better than the above IG-FET since it is less problematic for the problem relating to the influence caused by interfaces.

However, in the case of the J-TFT, being different from the foregoing IG-FET, when its semiconductor layer is formed from an amorphous silicon film or a polycrystal silicon film, there are problems such as were mentioned before. Because of this, such films are seldom used. Instead, it is usual to a single-crystal film such as single-crystal silicon film to constitute the semiconductor layer.

That is, in the case where the semiconductor layer of the J-TFT is constituted by an amorphous silicon film or a polycrystal silicon film, minority electric carriers injected from the emitter region will be recombined in the base region and it will become impossible for said minority carriers to be injected into the collector region due to that the diffusion length (L) of a minority electric carrier being extremely short in the amorphous silicon film. And in the case of using a polycrystal amorphous silicon, it is difficult to make such a desired junction so as to impart a good reverse bias due to the facts that the diffusion length (L) of a minority electric carrier is substantially short therein because of grain boundaries among the grains and electric current flows along such boundaries.

By the way, in the case where the semiconductor layer of the J-TFT is made from a single-crystal silicon film, there are unsolved problems that there are certain limits upon the scale and the kind of a J-TFT to be prepared and in any case, a product will unavoidably become costly.

In this respect, there is a demand to provide a process which makes it possible to prepare a semiconductor layer for a J-TFT using an amorphous silicon film or a polycrystal silicon film since the allowable use ranges for such films are much wider than that for a single-crystal silicon film although such films are accompanied with the foregoing problems.

In order to meet said demand, various studies have been made on an amorphous silicon film and a polycrystal silicon film. In fact, there has been made the thought that the foregoing problems on said films could be solved as long as it becomes possible to sufficiently enlarge the sizes of grains in said films and as a result, it will become possible to realize a practically applicable J-TFT using such films. On the basis of this thought, there has been made a proposal that the formation of a polycrystal silicon film to constitute the semiconductor layer of a J-TFT is carried out while maintaining the temperature of a substrate at an elevated temperature of more than 400° C. to thereby enlarge the sizes of grains caused in a film to be formed. This proposal is effective in certain aspects.

However, there problems for this proposal that it is impossible to use a commercially available substrate such as glass plate because a substrate is required to maintain at an elevated temperature and such substrate is not tolerative against such elevated temperature, and because of this, the kind of a substrate should be limited to a highly heat resistant one such as sapphire, silicon wafer, etc. which are expensive and the resulting J-TFT product will eventually become costly.

In addition, in the case of making a desired semiconductive junction in the preparation of a J-TFT using as the semiconductor layer a polycrystal silicon film deposited on a substrate such as glass plate which is not tolerative against an elevated temperature, it is almost impossible to practice a diffusion method and in most cases, there is employed an ion implantation method for which a specific equipment which is highly expensive is required to provide.

SUMMARY OF THE INVENTION

The present inventor has conducted extensive studies in order to solve the problems in the aforementioned known processes and in order to develop an improved process for effectively and simply preparing a junction type thin film transistor (J-TET) having a desirable semiconductor layer, for instance, a non-single-crystal silicon semiconductor layer having practically applicable characteristics.

As a result, the present inventor has finally found a process that enables efficient and stable preparation of a desirable semiconductor layer for J-TFT according to the simplified procedures detailed below.

It is therefore an object of this invention to provide a process which makes it possible to prepare a desirable J-TFT using an unexpensive commercially available substrate without using a specific and expensive equipment.

Another object of this invention is to provide a process which makes it possible to prepare a desirable constituent semiconductor layer for a J-TFT in accordance with the simplified procedures detailed below.

A further object of this invention is to provide a process which makes it possible to prepare a desirable constituent non-single-crystal silicon semiconductor layer on a commercially available substrate and to provide a practically applicable J-TFT which is usable in thin film type image-reading devices, thin film type image display devices, etc.

A still further object of this invention is to provide a process which makes it possible to prepare a large size J-TFT having a desirable constituent non-single-crystal silicon semiconductor layer on a commercially available substrate.

DESCRIPTION OF THE INVENTION

Figure 1:
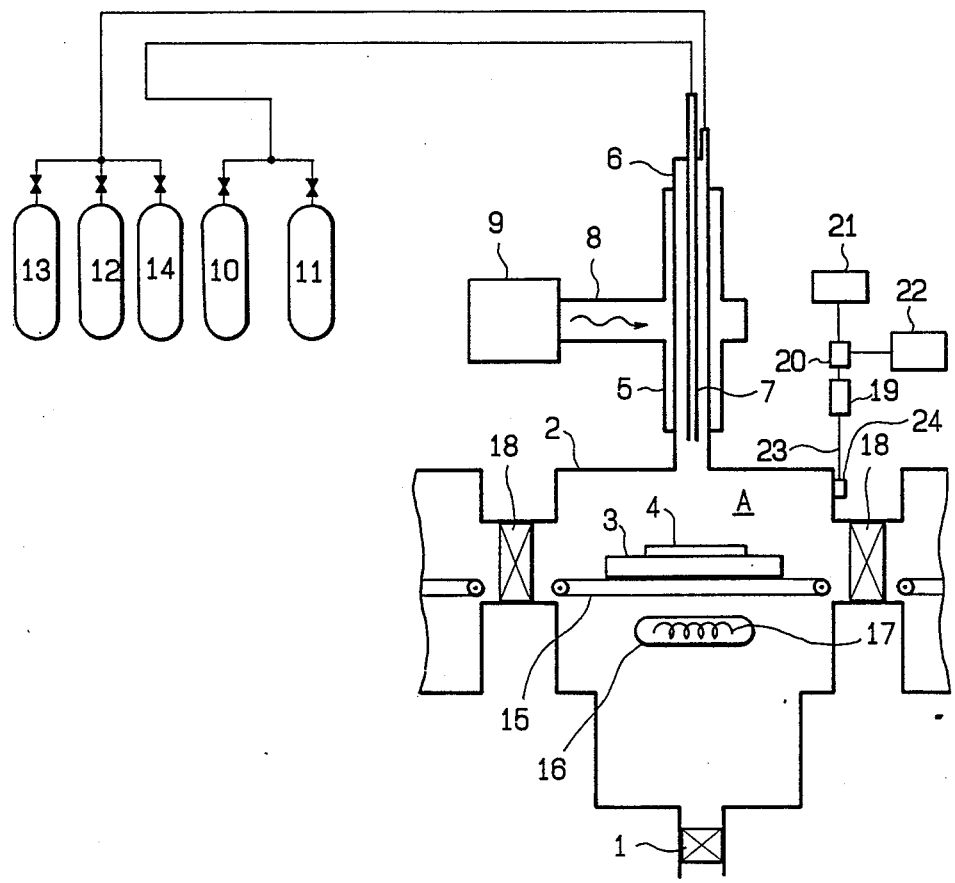
FIG. 1 is a schematic diagram of an apparatus suitable for carrying out the process for preparing a junction type transistor (J-TFT) according to this invention.

As a result of extensive studies in order to attain the foregoing objects of this invention, the present inventor has found a fact that in order to realize a desirable junction type transistor (J-TFT) having a polycrystal silicon semiconductor layer, it is an extremely important factor to heighten the quality of a polycrystal silicon film to constitute its base region to be such that the occurrence of the foregoing problems relating to recombination of minority carriers injected from the emitter region into the base region, which is found on the foregoing proposed J-TFT in the case where its base region is formed from a known polycrystal silicon film, is effectively and sufficiently prevented.

The present inventor has also found another fact that in addition to the above factor, the thickness of the polycrystal silicon film to constitute the base region is also an important factor. That is when the thickness of the base region is made sufficiently thin, it is possible for the base region to be prevented from having undesired influences caused by the grain boundaries in the polycrystal silicon film. However, when it is made excessively thin it becomes difficult to attain a desired junction between the related semiconductor layers and it also becomes difficult to form an electrode derived from the base region in the preparation of a device. In this connection, the present inventor has found that the lower limit for the thickness of the base region is about 1000 Å.

As a result of further studies on the basis of these findings, the present inventor has found the following facts. That is, as for the polycrystal silicon film to constitute the base region, it is desired to be such that both the size of a grain present therein and the thickness of said film is 1000 Å or more. In addition to this, said film is desired to be such that the localized level density of a grain boundary be made small so that electric current to flow along grain boundaries may be desirably diminished.

This invention has been accomplished based on the above findings, and it provides an improved junction type thin film transistor (J-TFT) and a process for the preparation the same.

According to one aspect of this invention, there is provided an improved J-TFT having a multi-layers stacked structure which attain the foregoing objects of this invention characterized in that at least its base region is formed from a specific polycrystal silicon film which is prepared according to the process of this invention.

According to a further aspect of this invention, there is provided a process for the preparation of said J-TFT, characterized by introducing a precursor A generated by activating a gaseous raw material (i) containing at least silicon atom and halogen atom in an activation space (a). a precursor B generated by activating a gaseous raw material (ii) containing at least hydrogen atom in an activation space (b), and if necessary, a precursor C generated by activating a gaseous raw material (iii) containing at least Group III atom or Group V atom of the Periodic Table in either the activation space (a) or the activation space (b), or in an different activation space (c) into a film forming space having a substrate being maintained with a desired temperature therein and chemically reacting them to thereby form a polycrystal silicon film to constitute at least its base region.

The term "precursor" means a material caused from a gaseous raw material as a result of activating said raw material by applying an activation energy thereon and which is reactive with other precursors and capable of contributing to the formation of a semiconductor film.

Now, as the above raw material (i) containing at least a silicon atom and halogen atom, there may be illustrated compounds represented by the following general formulas $$Si_nX_{2n+2} \tag{1}$$

wherein n is an integer of 1 to 3, and X is F, Cl, Br or I;

$$(SiX_2)_n \tag{2}$$

wherein $n \geq 3$, and X has the same meaning as defined in the formula (1).

As the above raw material (ii) containing at least a hydrogen atom, there may be illustrated $H_2$ and compounds represented by the following general formulas (3) and (4):

$$Si_nH_{2n+2} \tag{3},$$

$$SiH_nX_{4-n} \tag{4}$$

wherein n is an integer of 1 to 3, and X is F, Cl, Br or I.

As the above raw material (iii) containing at least Group III atom, there may be illustrated $B_2H_6$, $BF_3$, $Al(CH_3)_3$, $Ga(CH_3)_3$, etc As the above raw material (iii) containing at least Group V atom, there may be illustrated $N_2$, $NH_3$, $PH_3$, $PF_5$, $AsH_3$, etc.

According to the process of this invention, there can be effectively and stably formed a desirable polycrystal silicon film suited for use as a semiconductor layer in J-TFT that contains grains of 1000 Å or more in size, that is free from the foregoing problems relating to electric currents to undesirably flow along grain boundaries which are found on the known polycrystal silicon film, and that the localized state density of a grain boundary therein is small.

In order to form such desirable polycrystal silicon film by the process of this invention, it is necessitated to properly adjust the related film forming conditions.

That is, the first necessary condition is that the precursor A and the precursor B are reacted to form a reaction product containing at least SiF* (which means SiF in the excited state) in the film forming space.

Now, in any case, the precursor B is such that contains H* (which means atomic hydrogen in the excited state).

According to the experiment conducted by the present inventor, it has been recognized that there is an interrelation between the quantitative proportion of said H* and said SiF* to be present in the reaction system to cause the formation of a polycrystal silicon film on the substrate in the film forming space and the semiconductor characteristic of the resulting polycrystal silicon film.

That is, in the case where the quantity [H*] of said H* to be present is relatively superior to the quantity [SiF*] of said SiF* to be present n the above reaction system, the resulting polycrystal silicon film becomes such that contain large size particles and that is sharp in the particle size analysis.

As for the quantitative proportion of said [H*] to said [SiF*] that is, [H*]/[SiF*], since said H* and said SiF* are both luminescent species, it may be determined by measuring the luminescence intensity I [$H_\alpha$*] of a 656 nm wave length for the $H_\alpha$* (which means atomic hydrogen being excited to an α-state) and the luminescence intensity I [SiF*] of a 440 nm wave length for the SiF* and obtaining the ratio of said I[$H_\alpha$*] to said I[SiF*].

The determination of the above quantitative proportion of the [H*]/[SiF*] is carried out, for example, in the following way using a conventional luminescence intensity measuring device being provided with the fabrication apparatus as shown in FIG. 1.

The luminescence intensity measuring device in FIG. 1 comprises monochromator 19, photo-multiplier 20 direct current (DC) power source 21 and recorder 22. And with the monochromator 19, there is provided an optical guide 23 made of quartz fiber being connected an optical window 24 made of quatz glass provided with the circumferential wall of the film forming chamber 2.

Now, in the film forming operation in the fabrication apparatus shown in FIG. 1, when a gaseous mixture of $H_2$ gas and Ar gas and $SiF_4$ gas are introduced into the film forming space A, there are generated $H_\alpha$* and SiF* with the action of activation energy i.e. microwave discharge energy. The luminescent light of the thus generated $H_\alpha$* and that of the thus generated SiF* get into the monochromator 19 then photo-multiplier 20 through the optical window 24 and the optical guide 23, and they are recorded in the recorder 22.

In this invention, when the value of I[$H_\alpha$*]/I[SiF*] is $6 \times 10^{-3}$ or more, there may be obtained a polycrystal silicon film suited to constitute the base region of a J-TFT which contains large size particles (grains) and which is sharp in the particle size analysis.

For the upper limit for the value of I[$H_\alpha$*]/I[SiF*] in the film forming operation in this invention, it is properly determined having due regards to related situations such as producibility, etc. since the deposition rate of a polycrystal silicon film to be formed is likely to decrease as the quantity of $H_\alpha$* to be present in the reaction system in the film forming space A relatively increases.

However, it is desired to be a value of 1. In order to make the value of I[$H_\alpha$*]/I[SiF*] to be a desired value, it is carried out by properly selecting appropriate film forming parameters relating the kinds of gaseous raw materials to be used, their flow rates, their flow ratios, microwave power to be applied onto these gaseous raw materials, etc.

These parameters may be optimized by way of an appropriate feedback technique of monitoring the value of I[$H_\alpha$*]/I[SiF*] to be measured using the foregoing luminescence intensity measuring device.

In order to form a desirable polycrystal silicon film for the base region of a J-TFT in this invention, the temperature (Ts) of a substrate during the film forming operation is also an important factor. And it is properly determined in relation of other related film forming conditions. It is preferably 150° C. or more, more preferably, 200° C. or more, and most preferably, 270° C. or more.

For the upper limit of the Ts, it differs more or less upon the kind of a substrate to be used. For instance, in the case where a commercially available glass plate, which makes the resulting J-TFT to be of low cost, is used as the substrate, it is 450° C. or less.

According to the process of this invention, the formation of a junction between the foregoing polycrystal silicon semiconductor film with other film constituents for the preparation of a J-TFT may be desirably carried out by introducing the foregoing precursor C containing Group III atom or Group V atom into the film forming space.

As above described, there is a significant advantage for the process of this invention that there may be prepared a desirable J-TFT using a commercially available substrate such as ordinary glass plate, quartz glass plate, etc.

The superiority of the process according to this invention over any of known processes will be demonstrated by the following experimental results.

EXPERIMENTS (1) Preparation of Samples

Using a quartz glass plate of 0.2 mm in thickness, there were prepared four kinds [Samples (A) to (D)] of polycrystal silicon films of 5000 Å in thickness respectively in accordance with the process of this invention, glow discharging process, light induced CVD process and reactive sputtering process.

Sample (A) was prepared in accordance with the process of this invention using a fabrication apparatus shown in FIG. 1 under the film forming conditions shown in Table 1.

Details of the procedures and the apparatus will be later explained.

Sample (B) was prepared in accordance with a conventional glow discharging process using a known capacitive coupling glow discharge film formation apparatus of parallel-plane-plate type (hereinafter referred to as "glow discharge apparatus") shown in FIG. 2 under the film forming conditions shown in Table 2.

Figure 2:
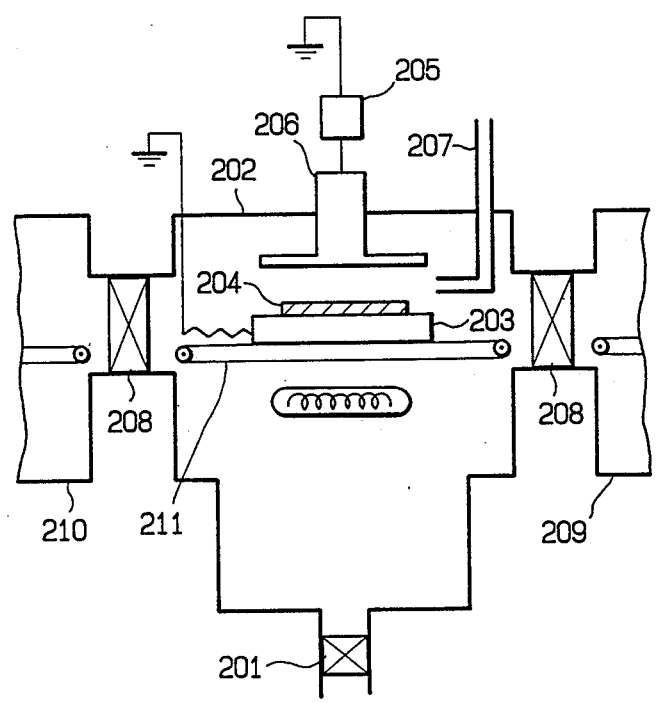
FIG. 2 is a schematic diagram of a known capacitive coupling glow discharge film deposition apparatus.

Referring to FIG. 2, a glow discharge in deposition chamber 202 is caused by applying a high frequency power to electrode 206 from high frequency power source 205. Gaseous raw materials such as $SiH_4$ gas, $H_2$ gas, $B_2H_6$ gas, etc. are introduced through feed pipe 207 into the deposition chamber 202 having a substrate 204 being placed on substrate holder 203 on substrate conveying means 211. 201 stands for exhaust valve With the glow discharge apparatus of FIG. 2, there are provided load-lock rooms 209, 210 through gate valves 208, 208 to which the film forming apparatus of FIG. 1 or other film forming apparatus may be connected.

Figure 3:
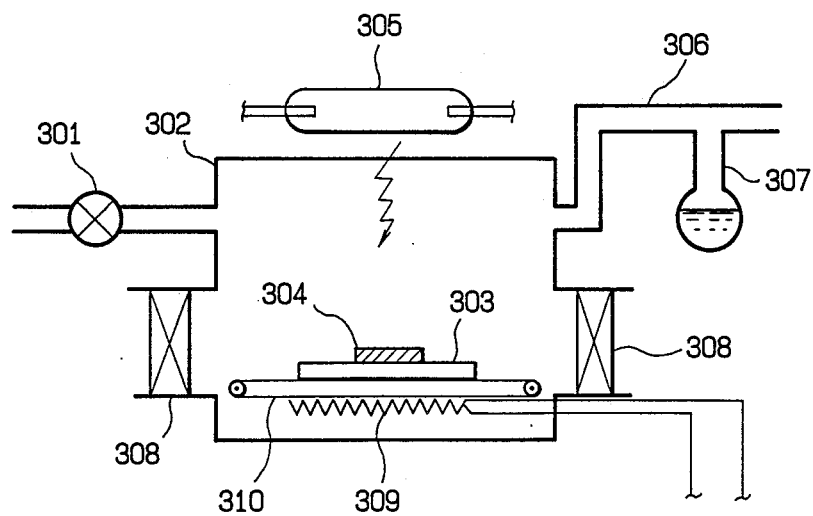
FIG. 3 is a schematic diagram of a known light induced CVD apparatus.

Sample (C) was prepared in accordance with a known light induced CVD process using a known mercury sensitizing light induced CVD apparatus using low-voltage mercury vapor lamp shown in FIG. 3 under the film forming conditions shown in Table 3. Referring to FIG. 3, ultraviolet rays from low-voltage mercury vapor lamp 305 are supplied on a gaseous mixture of a plurality of gaseous raw materials ($H_2$ gas, $Si_2H_6$ gas, $B_2H_6/H_2$ gas) introduced through feed pipe 306 in deposition chamber 302 having a substrate 304 being placed on substrate holder 303 on substrate conveying means 310. 309 stands for electric heater, and 308 stands for gate valve. Further, 301 stands for exhaust valve provided with exhaust pipe connected to the deposition chamber 302.

Figure 4:
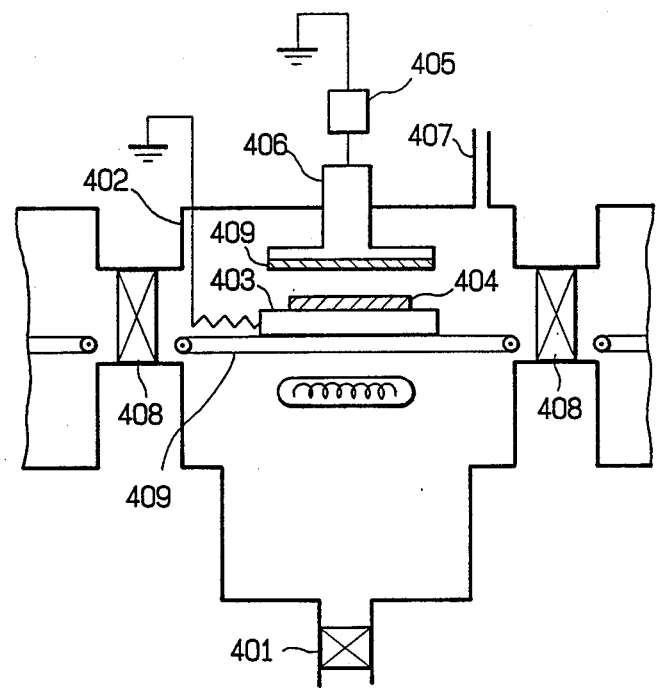
FIG. 4 is a known Ar-reactive sputtering apparatus.

Sample (D) was prepared in accordance with a known reactive sputtering process using a known Ar-reactive sputtering apparatus shown in FIG. 4 under the film forming conditions shown in Table 4.

Referring to FIG. 4, a high-frequency voltage from power source 405 is impressed onto electrode 406 to cause glow discharge between the electrode 406 and a substrate 404 being placed on substrate holder 403 on substrate conveying means in a Ar-containing gaseous atmosphere in deposition chamber 402 and to sputter a target (polycrystal silicon) 409. 407 stands for feed pipe for Ar gas, and 401 stands for exhaust valve provided with exhaust pipe. 408 stands for gate valve.

(2) Evaluations

There were examined an unpaired electron density ($N_s$) and a grain size (Å) on each of the resultant Samples (A) to (D).

As for the unpaired electron density, it was measured using a commercially available ESR device of JES-FEIXG type (product of JEOL, Ltd., Japan).

The results obtained were as shown in Table 5. As for the determination of the grain size, there was firstly conducted X-ray diffraction analysis using a commercially available X-ray diffractometer of XD-7A type (product of Shimazu Seisakusho Ltd., Japan) to obtain a X-ray diffraction peak, and then it was calculated from its full width at half maximum in accordance with a conventional method.

The results obtained were as shown in Table 5. Note: It is generally recognized that unpaired electron always depends upon a localized state in a polycrystal silicon film and said localized state is present chiefly in a grain boundary. In this respect, it is considered that the resultant unpaired electron density is corresponding to the localized state density of a grain boundary.

As for the grain size for the Sample (A). a sufficiently accurate was not obtained by the above method. Therefore, the value shown in Table 5 is of the lower limit.

As Table 5 illustrates, the Sample (A) prepared in accordance with the process of this invention surpassed the Samples (B) to (D) prepared in accordance with the known processes with respect to every evaluation item.

(3) Observations on changes in the J-TFT characteristics

There were examined changes in the J-TFT characteristics for respective cases where respective polycrystal silicon films to be prepared in accordance with the respective above processes employed in the preparations of Samples (A) to (D) [hereinafter referred to as Method A, Method B, Method C and Method D, respectively] were used as the base region for J-TFT.

There were provided a plurality of J-TFT Samples Sample [A-I] group to Sample [A-VII] group; Sample [B-I] group to Sample [B-VII] group; Sample [C-I] group to Sample [C-VII].group; and Sample [D-I] group to Sample [D-VII] group.

In each sample group, there were provided 100 J-TFTs. And, for each sample group, the thickness of the base region was changed as follows;

Sample I group: 500 Å
Sample II group: 800 Å
Sample III group: 1000 Å
Sample IV group: 1500 Å
Sample V group: 2000 Å
Sample VI group: 3000 Å
Sample VII group: 5000 Å

Sample [A] groups were prepared in accordance with the procedures, which will be later described in Example 1 of this invention, wherein the base region was prepared in accordance with the Method A.

Sample [B] groups to Sample [D] groups were prepared in the following ways.

That is, the collector region and the base region were prepared in accordance with the Method A, and the base region was prepared in accordance with the method B for Sample [B] groups, the method C for Sample [C] groups and the method D for Sample [D] groups. In these cases, there were used fabrication apparatuses so arranged as shown in FIG. 5.

Figure 5:
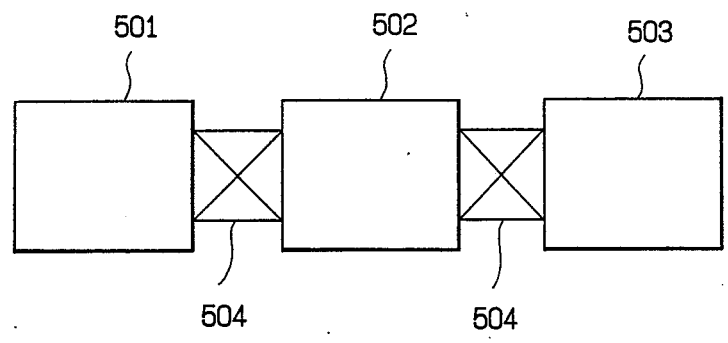
FIG. 5 is a schematic explanatory diagram of a continuously film forming apparatus using different apparatuses.

Referring to FIG. 5, there are shown load-lock room 501, first film forming apparatus 502 which is the fabrication apparatus of FIG. 2, the fabrication apparatus of FIG. 3 or the fabrication apparatus of FIG. 4, and second film forming apparatus 503 which is the fabrication apparatus of FIG. 1. The load-lock room is connected through gate valve 504 to the first film forming apparatus 502, which is connected through gate valve 504 to the second film forming apparatus.

And, the film formation on a substrate is carried out in the following way. That is, a substrate is first taken into the load-lock room 501, then conveyed into the second film forming apparatus 502 wherein there is formed a film to be the collector region, thereafter conveyed into the first film forming apparatus 502 wherein there is formed a film to be the base region, and finally conveyed into the second film forming apparatus wherein there is formed a film to be the emitter region. The resultant is taken out through the load-lock room 501.

For the thus obtained J-TFT Sample [A] groups to Sample [D] groups, there were evaluated J-TFT characteristics in accordance with a conventional method. And, those samples which exhibited defects in the J-TFT characteristics were omitted.

There were examined a current amplification ($\beta$) on every remaining sample in accordance with a conventional method. And for each sample group, there was calculated a mean value of the resultant current amplification values.

The results obtained are as shown in Table 6.

Further, for the resultant 100 J-TFT samples in every sample group, the proportion of the foregoing remaining J-TFT samples was shown as a yield (%) in Table 6.

According to the results shown in Table 6, it is recognized that in the viewpoint of the yield, it is necessary for the thickness of the base region to be 1000 Å or more.

However, it is understood from the results shown in Table 6 that in order to prepare a desirable J-TFT using a polycrystal silicon semiconductor film which exhibits the J-TFT characteristics desired therefor, the film forming process is indeed important. In fact, as Table 6 illustrates, it is understood that the method A corresponding to the process of this invention is sufficient enough to provide a desirable J-TFT having a polycrystal silicon semiconductor layer at least as the base region not only in the viewpoint of the J-TFT characteristics but also in the viewpoint of the yield.

PREFERRED EMBODIMENT OF THE INVENTION

The advantages of this invention are now described in more detail by reference to the following Examples, which are provided merely for illustrative purposes only, and are not intended to limit the scope of this invention.

In every Example, there was used a fabrication apparatus shown in FIG. 1.

Referring to FIG. 1, there is shown film forming chamber 2 having film forming space A. With the film forming chamber, there is provided an exhaust pipe having an exhaust valve (butterfly valve) 1 which is connected to an exhaust pump. In the film forming chamber 2, there is arranged a substrate conveying means 15 to hold a substrate 4 through a substrate holder 3 being placed thereon to convey the substrate into a load-lock room or other deposition chamber which are enclosedly connected thereto through gate valves 19. Numeral 16 stands for a substrate heating means such as tungsten halogen lamp (numeral 17 is a filament). A raw material gas supplying double structured conduit made of quartz comprising an outer cylindrical passage 6 and an inner cylindrical passage 7 is open through the upper wall of the film forming chamber into the film forming space A. The inner cylindrical passage 7 is open into the space formed by the circumferential wall of the outer cylindrical passage 6 which is adjacent to the film forming space A and which serves as a mixing space for mixing gaseous materials supplied through the outer cylindrical passage 6 and the inner cylindrical passage 7. With the external face of the circumferential wall of the outer cylindrical passage 6, there is provided an applicator 5 for a microwave to be transmitted through wave guide 8 from a microwave power source 9 which serves to apply a microwave energy into the outer cylindrical passage 6 and the inner cylindrical passage whereby activating gaseous raw materials to generate precursors.

The outer cylindrical passage 6 is connected through a feed pipe to gas reservoirs, for example, 12 for $SiF_4$ gas, 13 for $PF_5/SiF_4$ gas and 14 for $BF_3/SiF_4$ gas. Likewise, the inner cylindrical passage 7 is connected through a feed pipe to gas reservoirs, for example, 10 for Ar gas and 11 for $H_2$ gas.

EXAMPLE 1

There was used a Corning's No. 7059 glass plate (product of Corning Glass Works, Inc., U.S.A.) having a 500 Å thick chromium layer formed in accordance with a conventional reactive sputtering method thereon as the substrate 4. This glass plate was firmly attached onto the substrate holder 3, then the heating means 16 was actuated to uniformly heat the glass plate to about 300° C. and it was kept at this temperature.

Thereafter, the air in the film forming space A and other reacted spaces was evacuated to bring the film forming space to a vacuum of about $1 \times 10^{-6}$ Torr.

Successively, Ar gas, $H_2$ gas, and $SiF_4$ gas were supplied into the film forming space A at respective flow rates of 250 SCCM, 50 SCCM and 30 SCCM. At the same time, $PF_5$ gas was supplied with a concentration of 1000 ppm against the $SiF_4$ gas. After the flow rates of the above raw material gases became stable.

The inner pressure of the film forming space A was adjusted to a vacuum of about 0.7 Torr by regulating the exhaust valve 1. Thereafter, there was applied a microwave energy of 200 W into the outer cylindrical passage 6 and the inner cylindrical passage 7. After this state being continued for 100 seconds, there was formed a film of about 5000 Å in thickness on the glass plate. Then, the amount of the $PF_5$ was decreased to 50 ppm, and the above film forming procedures were repeated for an hour to thereby form another film of about 18000 Å in thickness on the previously formed film. Successively, the introduction of the PF$_5$ gas was terminated, instead there was supplied BF$_3$ the above film forming procedures were repeated for 10 minutes to thereby form a about 3000 Å thick film on the above deposited film.

Finally, the introduction of the above BF$_3$ gas was terminated, instead PF$_5$ gas was supplied with a concentration of 100 ppm against the SiF$_4$, and the above film forming procedures were repeated for 15 minutes to thereby form a film about 4500 Å in thickness on the previously formed film. The ratio of I[H$_\alpha$*]/I[SiF*] observed during the above formation of each layer was in the range between 0.01 and 0.2.

Figure 6A:
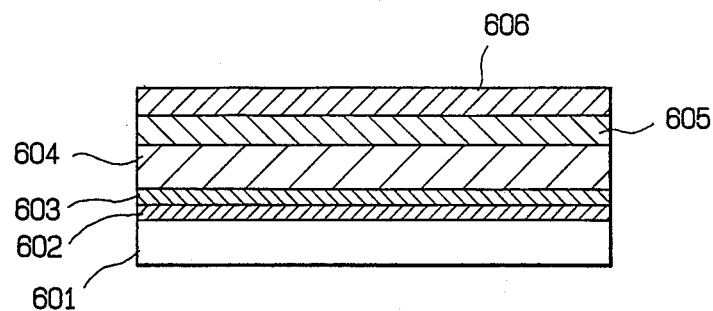
FIG. 6(A), FIG. 6(B), FIG. 6(C), FIG. 6(D) and FIG. 6(E) are schematic explanatory views of the processes to obtain a J-TFT in Example 1 of this invention.

Thus, there was obtained a multilayered product having the configuration shown in FIG. 6(A).

Referring to FIG. 6(A), there are shown glass plate substrate 601, chrominum layer 602, n$^+$-type layer 603, n-type layer (collector region) 604, p-type layer (base region 605 and n-type layer (emitter region) 606.

Figure 6B:
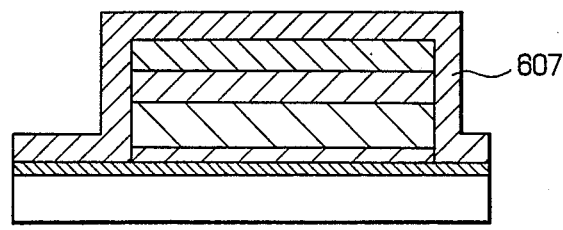

Then, from the product shown in FIG. 6(A), a part to be removed was removed in accordance with a conventional photolithographic method. Thereafter, there was deposited a A-SiN:H film by the glow discharge using a mixture of SiH$_4$ gas and NH$_3$ gas while maintaining the glass plate 601 at 250° C. in accordance with a conventional glow discharge decomposition method in the way as shown in FIG. 6(B), wherein numeral 607 stands for the deposited A-SiN:H film to be a passivation layer (a layer to serve for maintaining the semiconductor characteristics). Then, as shown FIG. 6(C), there was made a hole 608 passing through the passivation layer 607 and the emitter region 606 for a base electrode by way of a conventional photolithographic method and a conventional etching method using a 10 wt % of KOH aqueous solution. In this case, the etching of the emitter region 606 toward the base region 605 could be very easily accomplished within a short period of time.

Figure 6C:
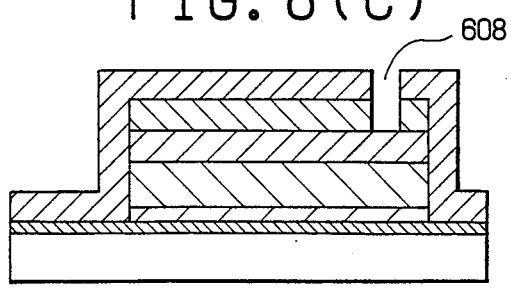
Figure 6D:
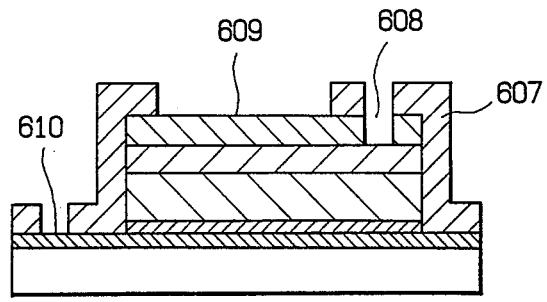

Likewise, with the resulting structure shown in FIG. 6(C). as shown in FIG. 6(D), a hole 609 was made for an emitter electrode and a hole 610 for a collector electrode.

With thus prepared resulting structure shown in FIG. 6(D), there were deposited aluminum layers for the respective holes in accordance with a conventional vacuum evaporation method and this was subjected to a conventional patterning process to form a base electrode 611, an emitter electrode 612 and a collector electrode 613 thereby obtaining a J-TFT as shown in FIG. (E).

For the thus obtained J-TFT, a V$_{BE}$ (base-emitter voltage)-I$_B$ (base electric current) characteristics and V$_{CE}$ (collector-emitter voltage)-Ic (collector electric current) characteristics respectively were examined in accordance with conventional methods.

Figure 7A:
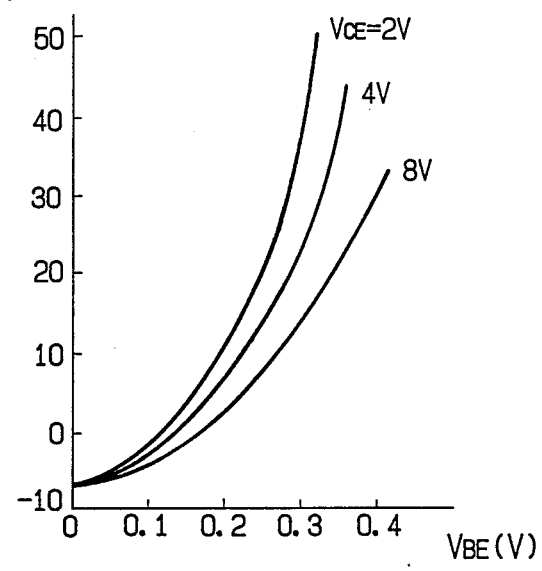
FIG. 7(A) and FIG. 7(B) are graphs of the results as a result of examining the resultant J-TFT in Example 1 of this invention.
Figure 7B:
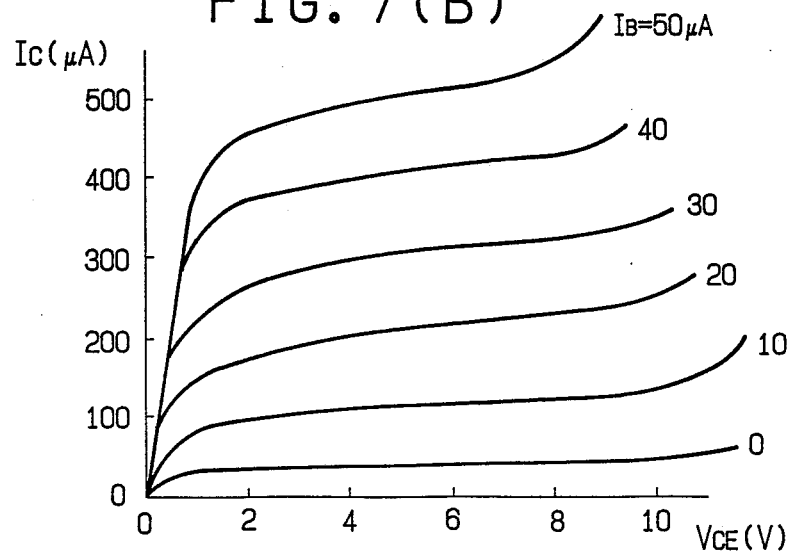

The results obtained were as shown in FIG. 7(A) (V$_{BE}$-I$_B$ characteristics) and FIG. 7(B) V$_{CE}$-Ic characteristics).

As FIG. 7(A) and FIG. 7(B) illustrate, it is understood that the resultant J-TFT is accompanied with excellent J-TFT characteristics. And, according to the results shown in FIG. 7(B), it is understood that for the resultant J-TFT, the amplifying factor ($\beta$) at the time of the emitter electrode being grounded is about 10, and because of this, it makes a sufficient signal operation as a J-TFT.

For comparative purpose, there were prepared a plurality of J-TFT samples respectively having base regions of different thicknesses (d) as shown in Table 7 by repeating the above procedures.

And, the resultant J-TFT samples were evaluated by repeating the above evaluation procedures.

As a result, there were obtained the results shown in Table 7.

Figure 6E:
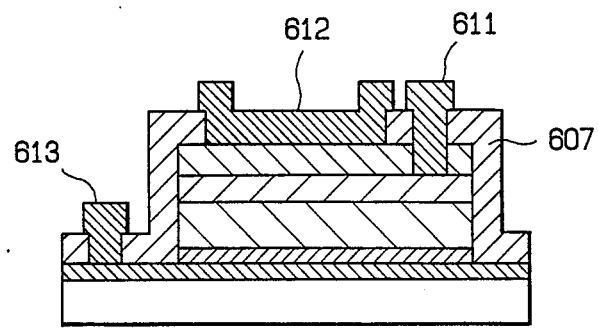

Further, as for the J-TFT shown in FIG. 6(E), its base region was replaced by a polycrystal silicon film of 1000 Å thickness formed by the glow discharge in a mixture of SiH$_4$ gas and H$_2$ gas while maintaining the glass plate at 350° C. in accordance with a conventional glow discharge decomposition method.

As a result of examining the thus resultant J-TFT, any signal operation was not observed.

EXAMPLE 2

The procedures of Example 1 were repeated to prepare a J-TFT having the configuration shown in FIG. 7(E), except that the film forming conditions for the first to the fourth layers were changed as below mentioned, and the etching method for making the hole for the base electrode was replayed by a conventional dry etching method using a mixture of CF$_4$ gas and O$_2$ gas;

first layer—
Ar gas: 250 SCCM; H$_2$ gas: 50 SCCM; SiF$_4$ gas: 30 SCCM; BF$_3$/SiF$_4$: 1000 ppm;

second layer—the above concentration of the BF$_3$ was changed to 50 ppm;

third layer—PF$_5$ gas was used instead of the above BF$_3$ and it concentration was controlled to 100 ppm; and fourth layer—the above PF$_5$ gas was replaced by BF$_3$ gas and its concentration was controlled to 100 ppm.

The thus obtained J-TFT was examined by repeating the evaluation procedures of Example 1.

As a result, it was found that the current amplification factor ($\beta$) at the time of the emitter electrode being grounded is about 9. And there was observed a sufficient amplifying operation therefor.

EXAMPLE 3

Figure 8:
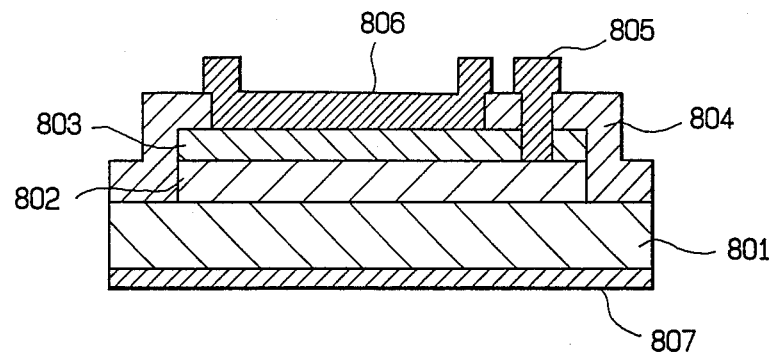
FIG. 8 is a schematic cross-sectional view of the J-TFT obtained in Example 3 of this invention.
Figure 9:
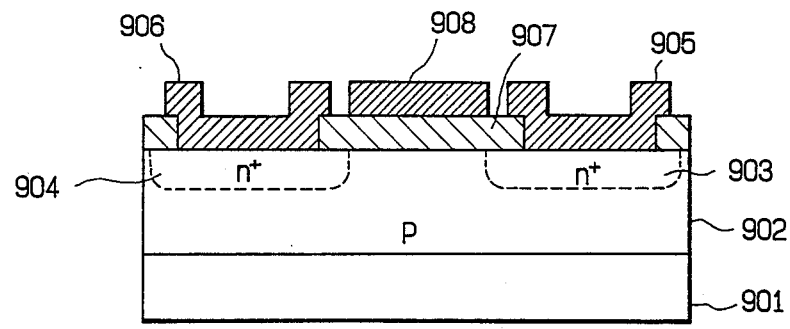
FIG. 9 is a schematic cross-sectional view of a known insulated gate field effect transistor.
Figure 10:
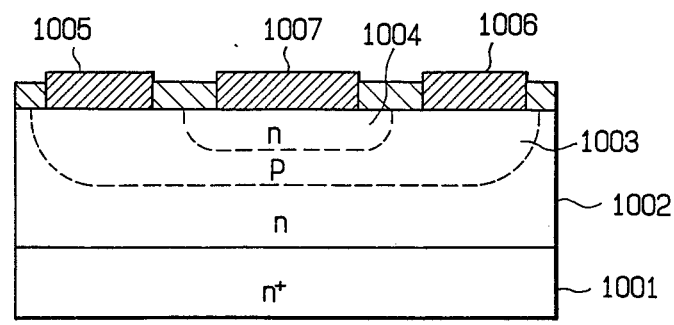
FIG. 10 is a schematic cross-sectional view of a known J-TFT.

In this example, there was prepared a J-TFT of the type as shown in FIG. 8 using an n-type As-doped polycrystal silicon plate of 10 cm resistivity as the substrate and using the fabrication apparatus shown in FIG. 1.

Referring to FIG. 8, there are shown polycrystal silicon substrate 801 which serves as a collector region, polycrystal silicon base region containing boron atom (B) 802, polycrystal silicon emitter region containing phosphorus atom 803, emitter electrode 806 and aluminum collector electrode layer 807 being disposed on the reverse surface of the substrate 801. The above polycrystal silicon plate was firmly attached onto the substrate holder 3, then the heating means 16 was actuated to uniformly heat the substrate to about 300° C. and it was kept at this temperature. Thereafter, the air in the film forming space A and other related spaces was evacuated to bring the film forming space A to a vacuum of about 1×10$^{-6}$ Torr. Then, Ar gas and H$_2$ gas were introduced into the film forming space A at respective flow rates of 250 SCCM and 50 SCCM. After the flow rates of the two gases became stable, the inner pressure of the film forming space was adjusted to about 0.7 Torr by regulating the exhaust valve 1. Thereafter, there was supplied a microwave energy of 200 W to form a hydrogen plasma atmosphere in the film forming space A for an one-minute period. Successively, SiF₄ gas was introduced into the film forming space A at a flow rate of 30 SCCM and BF₃ gas at a concentration of 100 ppm against the SiF₄. Then, the inner pressure of the film forming space A was readjusted to a vacuum of about 0.7 Torr. After this state being maintained for 10 minutes, there was formed a film of about 3000 Å in thickness. The introduction of the BF₃ gas was terminated, instead PF₅ gas was introduced into the film forming space A with a concentration of 100 ppm against the SiF₄, and the above film forming procedures were repeated for 15 minutes to thereby form a film of about 4500 Å in thickness on the previously formed film.

The thus obtained product was taken out from the fabrication apparatus, and it was processed in the same ways as in Example 1 to thereby obtain an objective J-TFT of the type shown in FIG. 8.

The evaluation procedures of Example 1 were repeated to examine the resultant J-TFT.

As a result, it was found that the current amplification factor ($\beta$) at the time of the emitter electrode being grounded is about 10. And there was observed a sufficient amplifying operation therefor.

TABLE 1

| | | | |
|---|---|---|---|
| Gas used and its flow rate (through outer conduit) | Ar<br>H₂ | 250 SCCM<br>50 SCCM | |
| Gas used and its flow rate (through inner conduit) | SiF₄<br>BF₃/SiF₄<br>(= 1000 ppm) | 27 SCCM<br>3 SCCM (100 ppm against SiF₄) | |
| Inner Pressure | | 0.7 Torr | |
| Discharging power of microwave (13.56 MHz) | | 200 W | |
| Substrate temperature | | 300° C. | |

TABLE 2

| | | | |
|---|---|---|---|
| Gas used and its flow rate | SiH₄<br>H₂<br>B₂H₆/H₂<br>(= 100 ppm) | 1 SCCM<br>50 SCCM<br>1 SCCM (100 ppm against SiH₄) | |
| Inner Pressure | | 0.7 Torr | |
| Discharging power of a high frequency (13.56 MHz) | | 50 W | |
| Substrate temperature | | 300° C. | |

TABLE 3

| | | |
|---|---|---|
| Gas used and its flow rate | H₂<br>Si₂H₆<br>B₂H₆/H₂<br>(= 100 ppm) | 200 SCCM<br>2 SCCM<br>1 SCCM |
| Inner Pressure | | 1.0 Torr |
| Power of a light energy source | | 30 mW/cm² (low voltage mercury-vapor lamp) |

TABLE 3-continued

| | |
|---|---|
| Substrate temperature | 300° C. |

TABLE 4

| | |
|---|---|
| Ar Inner Pressure | $10^{-2}$ Torr |
| Target vias | −300 V |
| Discharging power | 150 W |
| Distance between substrate and target | 50 mm |
| Substrate temperature | 300° C. |

TABLE 5

| Sample No. | Unpaired electron density (cm⁻³) | Average grain size (Å) |
|---|---|---|
| A | $2.2 \times 10^{15}$ | more than 2000 |
| B | $5.1 \times 10^{17}$ | about 250 |
| C | $3.7 \times 10^{17}$ | about 500 |
| D | $4.5 \times 10^{17}$ | about 300 |

TABLE 6

| Thickness of a base region (Å) | Method for the preparation of a base region | | | | | | | |
|---|---|---|---|---|---|---|---|---|
| | (A) | | (B) | | (C) | | (D) | |
| | $\beta$(%) | Yield (%) | $\beta$ (%) | Yield (%) | $\beta$ (%) | Yield (%) | $\beta$ (%) | Yield (%) |
| I    500 | — | 0 | — | 0 | 5.0 | 3 | — | 0 |
| II   800 | 16 | 27 | 1.4 | 3 | 3.5 | 28 | 2.0 | 4 |
| III  1000 | 15 | 65 | 0.9 | 12 | 1.3 | 68 | 1.1 | 19 |
| IV   1500 | 14 | 72 | 0.6 | 32 | 0.9 | 71 | 0.7 | 38 |
| V    2000 | 12 | 85 | 0.2 | 63 | 0.5 | 89 | 0.4 | 71 |
| VI   3000 | 10 | 94 | 0.1 | 79 | 0.3 | 92 | 0.3 | 87 |
| VII  5000 | 3 | 97 | 0 | 92 | 0.2 | 95 | 0.1 | 93 |

TABLE 7

| d | $\beta$ | Others |
|---|---|---|
| 500 | Impossible to evaluate | occurred short circuit between the collector region and the emitter region |
| 1000 | 15 | not actuated at a $V_{CE}$ of more than 3V |
| 3000 | 10 | — |
| 5000 | 3 | — |

What is claimed is:

1. A process for preparing a multi-layers stacked junction type thin film transistor having a base region of at least approximately 1000 Å in thickness comprising a polycrystal silicon-containing film having grains of at least 1000 Å in size, comprising forming said polycrystal silicon film by the steps of:

(a) generating a precursor (A) by activating a gaseous raw material in a first activation space using activating energy, said gaseous raw material selected from the group consisting of compounds represented by the general formula: $Si_nX_{2n+2}$ and compounds represented by the general formula: $(SiX_2)_n$, wherein n is an integer of 1 to 3 and X is F;

(b) generating a precursor (B) using activating energy in a second activation space which is separate from said first activation space said precursor (B) being chemically reactive with said precursor (A) so as to cause the formation of a film, and formed by activating a gaseous hydrogen-containing raw material selected from the group consisting of H₂ gas, compounds represented by the general formula: $Si_nH_{2n+2}$ and compounds represented by the general formula: $SiH_nX_{4-n}$, wherein n is an integer of 1 to 3 and X is F, Cl, Br or I, said precursor (B) including $H_\alpha^*$ species having a luminescence intensity $I[H_\alpha^*]$;

(c) introducing said precursor (A) and said precursor (B) into a film forming space separate from said first and second activation spaces, said film forming space having a substrate maintained at a temperature of at least 150° C. while regulating the amount said precursor (A) and the amount of said precursor (B) such that $I[H_\alpha^*]/I[SiF^*]$ is at least $6 \times 10^{-3}$ in said film forming space wherein $SiF^*$ is a species formed by the reaction of said precursor (A) and said precursor (B) having a luminescence intensity of $I[SiF^*]$; and (d) chemically reacting said precursor (A) and said precursor (B) in space surrounding the surface of the substrate so as to thereby form said polycrystal silicon film.

2. The process according to claim 1 wherein said precursor (A) contains $SiF_2$ radical.

3. The process according to claim 1 wherein said gaseous raw material containing Group III atom is a member selected from the group consisting of $B_2H_6$, $BF_3$, $Al(CH_3)_3$ and $Ga(CH_3)_3$.

4. The process according to claim 1 wherein said gaseous raw material containing Group V atom is a member selected from the group consisting of $N_2$, $NH_3$, $PH_3$, $PF_5$ and $AsH_3$.

5. The process according to claim 1, further including, generating a precursor (C) using activation energy in at least one of said first activation space or said second activation space, from a gaseous raw material containing atoms selected from the group consisting of Group III and said Group V of the periodic table and introducing said precursor (C) into said film-forming space to mix with said precursor (A) and said precursor (B).

* * * * *

UNITED STATES PATENT AND TRADEMARK OFFICE
CERTIFICATE OF CORRECTION

PATENT NO. : 4,900,694
DATED : February 13, 1990
INVENTOR(S) : KATSUMI NAKAGAWA

It is certified that error appears in the above-identified patent and that said Letters Patent is hereby corrected as shown below:

IN [57] ABSTRACT

Line 2, "transister" should read --transistor--.
　　　Line 13, "generates" should read --generated--.

COLUMN 1

Line 25, "minuature" should read --miniature--.
　　　Line 32, "method" should read --methods--.
　　　Line 35, "element" should read --elements--.

COLUMN 4

Line 66, "an" should read --a--.

COLUMN 6

Line 22, "quatz" should read --quartz--.

COLUMN 7

Line 47, "valve" should read --valve.--.

COLUMN 8

Line 53, "Samples" should read --Samples:--.

COLUMN 11

Line 5, "$BF_3$" should read --$BF_3$ gas with a concentration of 100 ppm against the $SiF_4$, and--.

UNITED STATES PATENT AND TRADEMARK OFFICE
CERTIFICATE OF CORRECTION

PATENT NO. : 4,900,694

DATED : February 13, 1990

INVENTOR(S) : KATSUMI NAKAGAWA

It is certified that error appears in the above-identified patent and that said Letters Patent is hereby corrected as shown below:

COLUMN 12

Line 32, Italics should be deleted, and "it" should read --its--.
　　Line 53, "atom 803," should read --atom 803, A-SiN:H passivation layer 804, base electrode 805,--.

Signed and Sealed this

Twenty-fifth Day of February, 1992

Attest:

HARRY F. MANBECK, JR.

*Attesting Officer*　　*Commissioner of Patents and Trademarks*